United States Patent
Calis et al.

(10) Patent No.: US 7,157,669 B2
(45) Date of Patent: Jan. 2, 2007

(54) ELECTRIC DOMESTIC APPLIANCE

(75) Inventors: Ursula Calis, Munich (DE); Jose Ramon Garcia Jiménez, Nussdorf (DE); Thomas Lieb, Munich (DE); Hans Seehuber, Ruhpolding (DE); Bernd Stitzl, Lauter (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 0 days.

(21) Appl. No.: 10/848,609

(22) Filed: May 18, 2004

(65) Prior Publication Data

US 2005/0006376 A1      Jan. 13, 2005

Related U.S. Application Data

(63) Continuation of application No. PCT/EP02/12337, filed on Nov. 5, 2002.

(30) Foreign Application Priority Data

Nov. 19, 2001   (DE)   ................. 101 56 771

(51) Int. Cl.
*H05B 3/02*   (2006.01)
(52) U.S. Cl. .................... 219/482; 219/492
(58) Field of Classification Search ............. 219/482, 219/489–490, 492, 506–509; 364/400; 348/734
See application file for complete search history.

(56) References Cited

U.S. PATENT DOCUMENTS

| | | | |
|---|---|---|---|
| 3,893,081 A | | 7/1975 | Hopkins |
| 5,005,123 A | * | 4/1991 | Mierzwinski ................. 700/90 |
| 6,809,301 B1 | * | 10/2004 | McIntyre et al. ........... 219/506 |
| 2003/0007104 A1 | * | 1/2003 | Hoshino et al. ............ 348/734 |
| 2003/0020004 A1 | | 1/2003 | Reime |

FOREIGN PATENT DOCUMENTS

| | | |
|---|---|---|
| DE | 4207772 | 9/1993 |
| DE | 4207772 C2 | 9/1993 |
| DE | 29521593 U1 | 11/1997 |
| WO | WO 03/044955 A3 * | 5/2003 |

* cited by examiner

*Primary Examiner*—Tu Hoang
(74) *Attorney, Agent, or Firm*—Russell W. Warnock; Craig J. Loest

(57) ABSTRACT

An electrical domestic appliance containing a main switch for turning the current power supply to the electrical domestic appliance on and off. The main switch having a predetermined turn-on time period during which the main switch must be actuated in order to move from the off-position to the on-position. The main switch predetermined turn-on period can be selected and adjusted by the customer through predetermined time limits.

26 Claims, 2 Drawing Sheets

ELECTRIC DOMESTIC APPLIANCE

BACKGROUND OF THE INVENTION

1. Field of the Invention

The invention relates to an electric domestic appliance which includes a main switch for switching a power supply on and off, which exhibits a predetermined turn-on actuation time period during which it must be actuated in order to be shifted from its off-position into its on-position.

Electrical domestic appliances for which the invention can be used are, in particular, free-standing or installable cookers, ovens, hotplates, grill appliances, coffee machines, dishwashers, washing machines, and dryers.

2. Discussion of the Related Art

The expression "main switch" is used within the framework of the disclosure of the invention to stand for any type of device or element by means of which a power supply can be switched on and off. Thus, a "main switch" can be an individual switch or an electric circuit, which exhibits electrical or electronic components and one or more buttons or sensors. The sensors can be contact sensors or sensors which operate free of contact, such as the prior art already shows.

An electrical domestic appliance is known from DE 42 07 772 C2. There is described a main switch for turning a current supply on and off. The main switch exhibits a predetermined turn-on actuation time period. The main switch must at least be actuated in order for it to be shifted from its off-position to its on-position. The document discloses a main switch in the form of an electric circuit, which exhibits a sensor (light sensor) as its operating element, which must be actuated within a predetermined actuation time period in the range between 0.5 sec. and 1.0 sec. in order to shift the main switch from the off-position into the on-position. This movement only takes place, however, if only this one sensor is actuated, but not if further sensors (light sensors) adjacent to it are touched simultaneously or are covered by a cooking pot or a cloth which has been left lying on it, and reflect light as a result. All the sensors are located on a carrier plate beneath a glass ceramic plate, which is translucent for the light from a light source. The glass ceramic plate forms a cooking surface which contains one or more cooking zones. Adjustment of the time period between the start of actuation and the actual shifting of the main switch from the off-position to the on-position can be achieved by means of an electric time delay element, such as a resistor-capacitor series circuit connection with an electrical tapping point in between, or by means of an electrical circuit with a counter which simulates in a digital manner the properties of the resistor-capacitor circuit.

DE 295 21 593 U1 shows a glass-ceramic hob in the form of a heating hob, which exhibits several cooking zones. An actuating device exhibits contact switches or contact-free switches, by means of which the cooking zones can be switched on and off, and various different temperatures or functions can be set and adjusted. The actuating device contains an on-off button as the main switch, which, when switched on, exhibits a time delay in the range of one to five seconds. The intention is that undesirable switching on should be avoided, for example if a damp cloth is wiped over the on-off button for cleaning purposes.

The actuation time period during which the main switch must be touched or pressed or actuated by fingers being brought close to it, in order for it to shift from an off-position to an on-position, is also a child safety measure. With younger children the risk pertains that they might turn the main switch on unobserved by an adult and so switch on the cooking surfaces, cookers, and ovens. This can lead to a user subsequently burning a hand on a hot cooking plate, or could even cause a fire.

The actuation time, i.e. the dwell time required for a finger on a main switch, which is provided in touch-control technology, up to the actual activation of the domestic appliance, is selected nowadays in such a way that it represents a compromise between erroneous operation safeguard and simple rapid operation. In order to avoid the appliance being switched on unintentionally, for example when cleaning and wiping with a washing-up cloth, or by small children, the actuation time period should be as long as possible. However, in order for operation to be as simple and rapid as possible, the dwell time should be as short as possible. For cooking surfaces, an actuation time for the main switch nowadays is typically, for example, about 0.5 sec.

In earlier designs of cooking surfaces, cookers, and ovens, which have a hob or a glass-ceramic cooking surface, the main switch was sometimes arranged in the rear area of the appliance, so that it was difficult for children to reach, so providing an additional child safety measure. Nowadays the arrangement of sensor operating elements for cooking surfaces is for preference in the front part of the cooking surface, because this is ergonomically more favourable. The arrangement of the main switch in the rear area of the glass-ceramic cooking surfaces is difficult from a technical point of view and also with regard to costs, because, for example, an individual PCB, an additional set of wiring, and modifications to the housing are required. With normal ovens which exhibit a touch-control operation, the main switch, or at least its operating element, can frequently only be arranged on a facia panel.

The invention is intended to resolve the problem, by simple means, of minimising the risk of unintentional switching on of domestic appliances and the risks associated with this. In particular, it is intended that danger to children and damage to property due to children playing should be minimised, in that the unintentional operation of domestic appliances, and of cooking surfaces, cookers, and ovens in particular, should be impeded.

BRIEF SUMMARY OF THE INVENTION

This problem is resolved according to the invention in that the length of the actuation time period required for the activation of the main switch can be adjusted by a user on the finished domestic appliance at the customer's premises, by means of actuation period adjustment means provided for this purpose.

According to the invention, the actuation time period for the main switch can be selected and adjusted by the customers themselves. No qualified technician is required. This results in extended child safeguarding. If, after an initially short actuation time period of the main switch, the actuation time period of the main switch is extended, a child will already remove its finger from the main switch after the earlier shorter actuation time period, so that the switch does not shift from the switch-off position into the switch-on position. It is therefore to the purpose for the domestic appliance to be delivered to the customer with a fixed and preferentially fixed-programmed value as the minimum actuation time period. This accordingly means that, as early as the time of delivery, security against unintentional actuation of the domestic appliance will be provided. Depending on the design form of the domestic appliance which is desired, the customer can be provided with a choice of one, two, or more extended actuation time periods. According to special embodiments, the actuation time period can be freely adjusted by the customer in a specific time window, for example between 0.5 sec. and 5.0 sec., either infinitely adjustable or in increments depending on the design. These adjustment possibilities are intended to be implemented for costs reasons for preference without additional hardware, for example by the use of programs which are in any event already present in the appliance for other functions, e.g. software, such that, for example, the adjustment takes place directly by means of a combination of buttons or a button actuation sequence, taking account of the button actuation time period and/or the location of the button, or by the adjustment being carried out by switching the domestic appliance into a programming mode, if, as is usual today, the appliance contains one or more data-processing programs. As a result, no additional costs are incurred in the realisation of the invention, but only a program change, or possibly additional software. The time duration period adjustment means referred to within the framework of the invention can therefore be realised not only by additional elements, but are for preference realised by a program change of the programs used in the domestic appliance.

The invention has the following advantages in particular:

Increase in child safety, since it is improbable that children at play will leave their fingers in the same place for as long as several seconds. The actuation time period is variable, so that, once the children have passed the critical age, the actuation time period can be reset to an original short value which is convenient for operation. The invention can be implemented in a domestic appliance without additional costs for hardware. Main switches in touch-technology format are always more popular in relation to mechanical main switches, and are particularly well-suited for the realisation of the invention.

The invention is of particular interest to cooking appliances, because the working environment imposes high demands on ease of cleaning, which leads to ever more use of touch sensors due to the possibly closed surface of the cooking area, and these can also be used for the realisation of the invention, whereby touch sensors which are already present for other functions can also be used for the invention. With cooking surfaces in particular, the health hazards (burns) and damage to property (house fires) in the event of unintentional actuation of the appliances by children are very high, and devastating consequences may follow. According to the invention, access to the main switch by children need not be restricted. The main switch can be arranged at an ergonomically favourable location for operation by an adult, without safety for children being lost.

The means for adjusting the actuation time period can be, according to the invention, adjustable electrical components such as adjustable electrical resistors or adjustable capacitors, or data-processing programs or parts thereof, in which the actuation time period can be variably programmed and called up, or in which actuation time periods are permanently stored and can be called up, and they may contain manual operating elements and/or be remotely controlled, for example via telephone lines, wireless radio communications, via the Internet, etc.

The time period adjustment means can be designed for infinite or incremented adjustment of the actuation time period.

The operating element or elements of the main switch can be buttons or sensors, which for preference are designed in touch-control technology. They can be contact sensors or sensors which operate free of contact.

BRIEF DESCRIPTION OF THE SEVERAL VIEWS OF THE DRAWING

The invention is described hereinafter by reference to the drawings, and on the basis of preferred embodiments as examples. The drawings show.

DETAILED DESCRIPTION OF THE INVENTION

Figure 1:
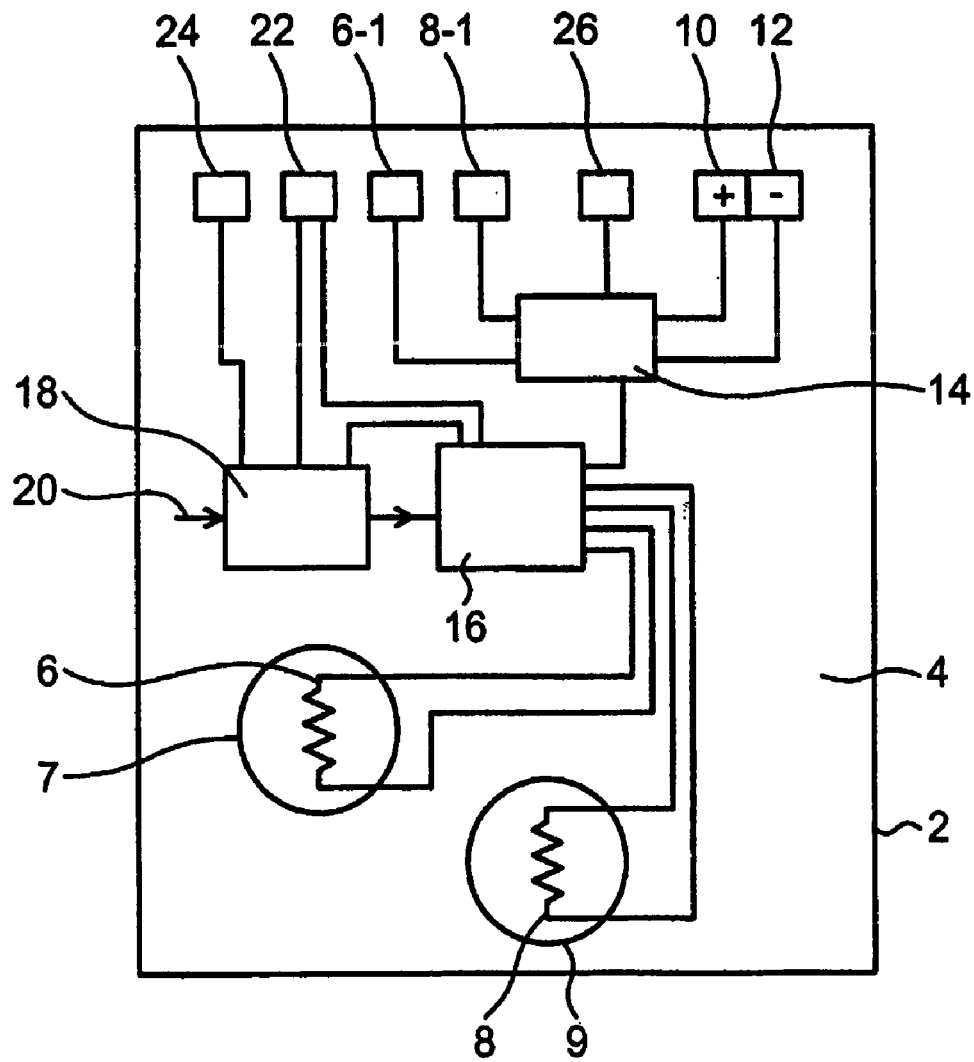
FIG. 1 a diagrammatic representation of an electrical domestic appliance according to the invention, FIG. 2 a diagrammatic representation of a further embodiment of a domestic appliance according to the invention.

The electrical domestic appliance 2 shown in diagrammatic plan view in FIG. 1 is, for example, a cooker with a ceramic plate 4, located beneath which are electrical heating elements 6 and 8 respectively in cooking areas 7 and 9 respectively. These can be selected by means of sensors 6-1 and 8-1 respectively. Their heating strength can be adjusted by further sensors, such as a plus sensor 10 or a minus sensor 12. The control of the heating elements 6 and 8 of the cooking areas 7 and 9 is effected by means of a dataprocessing unit 14 of a control device 16. The power supply for the control device 16 and the heating elements 6 and 8 is effected by means of a main switch 18, which can be switched on for the conducting of current 20 and switched off in order to interrupt the current respectively. The actuation of the main switch 18 is effected by an actuating element 22, for preference a button or sensor. The sensor can be a contact-free sensor or a contact sensor.

The main switch 18 has a predetermined switch-on actuation time period, during which the operating element 22 must be actuated by a person, for example by bringing a finger close to it or touching it, so that it shifts from its turn-off position into its turn-on position. According to the invention, the length of the actuation time period can be adjusted on the finished domestic appliance by a user by means of the time period adjustment means provided for this purpose.

As adjustment means, use can be made for this purpose of one or more of the operating elements 22, 24, 6-1 already present, and/or 8-1 in combination with the control device 16 and its data-processing unit 14.

According to one embodiment, a program of the data-processing unit 14 contains values which can be called up for different actuation time periods. According to another embodiment, the program is programmable by one or more of the operating elements in order to produce a desired change and adjustment of the actuation time period. The calling up and programming or adjustment of the different actuation time periods is effected by a predetermined actuation sequence of one or more of the operating elements 22, 24, 6-1 and/or 8-1, depending on what the domestic appliance is designed for. No additional hardware or software is required.

According to another embodiment, additional time period adjustment means can be provided for in the form of hardware 24, e.g. a switch, button, or additional sensor, at which the actuation time period can be adjusted and set manually in the data-processing program, or, according to another embodiment, without a data-processing program directly in the main switch 18. With simpler domestic appliances in particular this is an economical and effective solution, which no computer program 14 has, or no program not suitable for this purpose.

In addition to the measures described, or instead of these measures, it is also possible to make provision for a remote-control receiver device 26 to be provided in the domestic appliance 2, in order to change and adjust the actuation time period by remote control, for example via the Internet or other telecommunications systems, radio-controlled, etc.

In FIG. 1, the control device 16 and the data-processing unit 14 therefore fulfil the functions of the main switch 18. The main switch 18 in this embodiment is therefore partially formed by the control device 16 and its data-processing unit 14.

Figure 2:
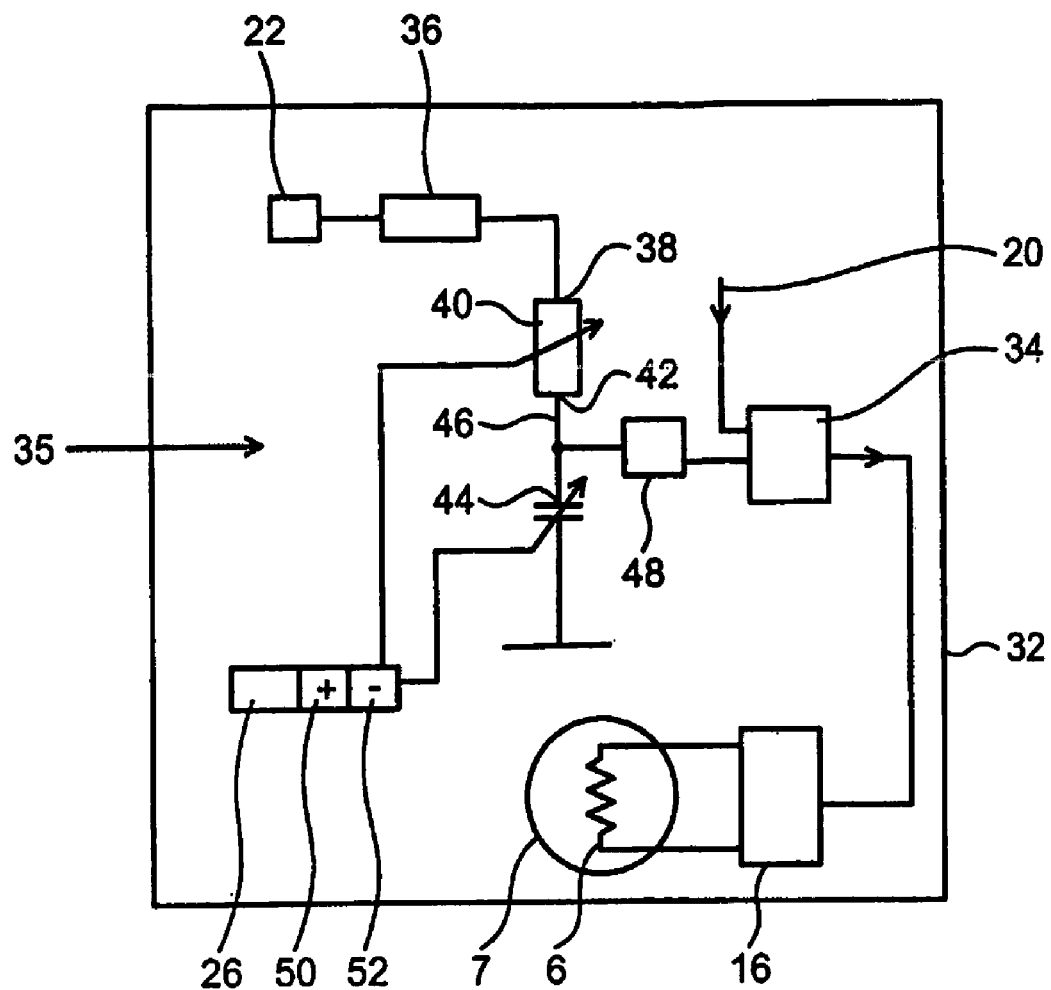

FIG. 2 shows a domestic appliance 32 according to the invention in diagrammatic form and not to scale. Shown symbolically for one or more cooking areas is a cooking area 7 with an electrical heating element 6, which is switched on and off by an electronic control device 16, and is controlled or regulated with regard to the current strength. The current supply for the control device 16 is effected via a load interrupter switch 34, which is part of a main switch 35 for switching on and off the supply of current 20. The other parts of this main switch 35 are described hereinafter. A manually actuatable operating element 22 in the form of a button or sensor, whereby this can be a contact-free sensor or a contact sensor, issues a signal via a pulse generator 36 to a connection 38 of an adjustable electrical resistor 40, of which another connection 42 is connected to an adjustable capacitor 44, which is set to the reference potential. The electrical connection 46 between the two connections 42 and 44 is connected to a trigger 48, which actuates the load interrupter switch 34. The voltage distributor, consisting of the resistor 40 and the capacitor 44, has the effect of the signal from the operating element 22 only passing to the trigger 48 after a predetermined time period. This time period is the actuation time period, during which the operating element 22 must be actuated (touched or pressed or otherwise actuated), in order for the trigger 48 to switch the load interrupter switch 34 from it turn-off position into its turn-on position. This actuation time period can be changed and set by changing the resistance value of the resistor 40 and/or by adjusting the capacitance value of the capacitor 44. Provision can be made for this purpose, for example, of a plus button 50 and a minus button 52 for extending the time or shortening the time. In this case, too, a remote control receiving element 26 can be provided for changing and setting the actuation time period. Only one of the two elements, the resistor 40 or capacitor 44 need to be adjustable. It is to the purpose, however, for both to be adjustable.

The domestic appliance 32 from FIG. 2 can in turn be an oven or a hob with a cooking surface, which exhibits the electrical heating element 6. As mentioned in the preamble, however, it may also be another domestic appliance, which exhibits a heating element or contains a rotation element, which it is intended should not be turned on unintentionally, for example by a child or by cleaning, such as a washing machine drum or a stirring device of a domestic stirring machine.

By contrast with the turn-on procedure it is intended that the turn-off procedure should in each case take place without delay when the main switch is actuated.

The invention claimed is:

1. An electrical domestic appliance, comprising:
   a main switch for turning the current supply to the domestic appliance on and off;
   said main switch having a predetermined turn-on actuation time period, during which time period said main switch must remain engaged by an operator in order for said main switch to be operatively shifted from its off-position to its on-position; and
   an assembly for resetting said predetermined turn-on actuation time period wherein said main switch predetermined turn-on actuation time period is selectable and adjustable within predetermined limits by an operator in a post-manufacture environment.

2. The domestic appliance according to claim 1, including said time duration adjustment assembly include program parts in a data-processing unit.

3. The domestic appliance according to claim 2, including said program parts having a plurality of different actuation time periods, which can be utilized by said data-processing unit.

4. The domestic appliance according to claim 2, including said program parts being programmable to a plurality of different actuation time periods, which can be utilized by said data-processing unit.

5. The domestic appliance according to claim 1, wherein said time duration adjustment assembly includes a plurality of manually adjustable elements provided on said domestic appliance.

6. The domestic appliance according to claim 1, wherein said main switch is a touch-control technology actuated switch.

7. The domestic appliance according to claim 1, wherein said main switch is a contact sensor actuated switch.

8. The domestic appliance according to claim 1, wherein said main switch is a contact free sensor actuated switch.

9. The domestic appliance according to claim 1, wherein said main switch predetermined turn-on actuation time period limits are in a range from about one-half (0.5) seconds to five (5.0) seconds.

10. The domestic appliance according to claim 1, wherein said main switch predetermined turn-on actuation time period limit minimum value is substantially about one-half (0.5) seconds.

11. The domestic appliance according to claim 1, wherein said main switch predetermined turn-on actuation time period limits are selectable and adjustable remotely.

12. A method for turning the current supply to an electrical domestic appliance on and off, comprising:
   providing a main switch for turning the current supply to the domestic appliance on and off;
   engaging said main switch, and maintaining said switch engagement for a predetermined turn-on actuation time period in order to operatively switch said main switch from its off-position to its on-position; and
   providing a predetermined turn-on actuation time period adjusting assembly for use by at least one operator of the domestic appliance in a post-manufacture environment for selecting and adjusting said main switch predetermined turn-on actuation time period within predetermined limits.

13. The method according to claim 12, wherein said step of providing an adjustment assembly includes providing a data-processing unit for selecting and said method further includes the step of adjusting said main switch predetermined turn-on actuation time period within said predetermined limits.

14. The method according to claim 13, including storing a plurality of different actuation time periods in said data-processing unit for selecting and adjusting said main switch predetermined turn-on actuation time period.

15. The method according to claim 13, including programming a plurality of different actuation time periods in said data-processing unit for selecting and adjusting said main switch predetermined turn-on actuation time period.

16. The method according to claim 12, including providing a plurality of manually adjustable elements on said domestic appliance for selecting and adjusting said main switch predetermined turn-on actuation time period.

17. The method according to claim 12, including providing a touch-control technology actuated switch for said main switch for selecting and adjusting said main switch predetermined turn-on actuation time period.

18. The method according to claim 12, including providing a contact sensor actuated switch for said main switch for selecting and adjusting said main switch predetermined turn-on actuation time period.

19. The method according to claim 12, including providing a contact free sensor actuated switch for said main switch for selecting and adjusting said main switch predetermined turn-on actuation time period.

20. The method according to claim 12, including remotely selecting and adjusting said main switch predetermined turn-on actuation time period within said predetermined limits.

21. An electrical domestic appliance, comprising:
   a main switch for turning the current supply to the domestic appliance on and off;
   said main switch being configured for a having a predetermined switch-on actuation time period during which time period said main switch must remain engaged by a person for operatively shifting said main switch from a turn-off position to a turn-on position; and
   means for adjusting the predetermined switch-on actuation time period by time duration adjustment in a post-manufacture environment by a user.

22. The domestic appliance according to claim 21, further comprising a data processing unit and a control device for controlling operation of the appliance, and said means for adjusting the predetermined switch-on actuation time period includes an operating computer program being run on the data processing unit in a manner in which the time duration of the predetermined switch-on actuation time period can be adjusted by a user.

23. The domestic appliance according to claim 21, wherein said means for adjusting the predetermined switch-on actuation time period is at least one of an adjustable value capacitor and adjustable value resistor connected to at least one operating element for turning on the appliance, wherein the value of the at least one of the capacitor and the resistor can be adjusted to delay an actuation signal from the at least one operating element from turning on the domestic appliance by an amount of time equal to a selected switch-on actuation time.

24. The domestic appliance according to claim 21, wherein said appliance has at least one exposed cooking surface controlled by said at least one operating element, and said means for adjusting is operatively connected to said at least one operating element for controlling an on/off state of said at least one exposed cooking surface.

25. The domestic appliance according to claim 22, wherein said appliance has at least one exposed cooking surface controlled by said at least one operating element, and said means for adjusting is operatively connected to said at least one operating element for controlling an on/off state of said at least one exposed cooking surface.

26. The domestic appliance according to claim 23, wherein said appliance has at least one exposed cooking surface controlled by said at least one operating element, and said means for adjusting is operatively connected to said at least one operating element for controlling an on/off state of said at least one exposed cooking surface.

* * * * *